United States Patent
Lesartre

(10) Patent No.: US 10,417,091 B2
(45) Date of Patent: Sep. 17, 2019

(54) MEMORY DEVICE HAVING ERROR CORRECTION LOGIC

(71) Applicant: HEWLETT-PACKARD DEVELOPMENT COMPANY, L.P., Houston, TX (US)

(72) Inventor: Gregg B. Lesartre, Fort Collins, CO (US)

(73) Assignee: Hewlett Packard Enterprise Development LP, Houston, TX (US)

( * ) Notice: Subject to any disclaimer, the term of this patent is extended or adjusted under 35 U.S.C. 154(b) by 283 days.

(21) Appl. No.: 14/767,479

(22) PCT Filed: Mar. 25, 2013

(86) PCT No.: PCT/US2013/033679
§ 371 (c)(1),
(2) Date: Aug. 12, 2015

(87) PCT Pub. No.: WO2014/158130
PCT Pub. Date: Oct. 2, 2014

(65) Prior Publication Data
US 2015/0378823 A1 Dec. 31, 2015

(51) Int. Cl.
*G06F 11/10* (2006.01)
*G06F 3/06* (2006.01)
*G11C 29/04* (2006.01)

(52) U.S. Cl.
CPC ......... *G06F 11/1076* (2013.01); *G06F 3/064* (2013.01); *G06F 3/0619* (2013.01); *G06F 3/0673* (2013.01); *G06F 11/1048* (2013.01); *G11C 2029/0411* (2013.01)

(58) Field of Classification Search
CPC ............. G06F 11/1076; G06F 11/1048; G06F 3/0619; G06F 3/064; G06F 3/0673; G11C 2029/0411
See application file for complete search history.

(56) References Cited

U.S. PATENT DOCUMENTS 6,119,260 A 9/2000 Tomisawa et al.
6,317,371 B2 11/2001 Katayama et al.
(Continued)

FOREIGN PATENT DOCUMENTS

CN 101325090 A 12/2008
EP 1538525 A1 * 6/2005 ............. G11C 16/10
(Continued)

OTHER PUBLICATIONS

Bakos, J.D. et al., Lightweight Error Correction Coding for System Level Interconnects, (Research Paper), Published in IEEE Transactions on Computers, Mar. 1, 2007, pp. 289-304, vol. 56, No. 3.
(Continued)

*Primary Examiner* — Kyle Vallecillo
(74) *Attorney, Agent, or Firm* — Trop, Pruner & Hu, P.C.

(57) ABSTRACT

Data is read from memory cells in the memory device. The read data is transferred over a link to a memory controller that is external of the memory device. While the transferring of the read data is ongoing, error detection of the read data is performed inside the memory device using an error correction code.

14 Claims, 3 Drawing Sheets

(56) References Cited

U.S. PATENT DOCUMENTS

| | | | |
|---|---|---|---|
| 6,351,412 B1* | 2/2002 | Nozoe | G06F 11/1068 |
| | | | 365/185.09 |
| 6,674,385 B2 | 1/2004 | Micheloni et al. | |
| 7,823,044 B2* | 10/2010 | Simon | G11C 16/10 |
| | | | 714/746 |
| 8,195,978 B2 | 6/2012 | Flynn et al. | |
| 8,201,058 B2 | 6/2012 | Shrader et al. | |
| 2005/0125708 A1* | 6/2005 | Simon | G11C 16/10 |
| | | | 714/6.24 |
| 2007/0260828 A1* | 11/2007 | Swaminathan | G06F 13/1668 |
| | | | 711/154 |
| 2008/0005647 A1 | 1/2008 | Bains | |
| 2008/0016269 A1* | 1/2008 | Chow | G06F 13/1684 |
| | | | 711/103 |
| 2008/0082872 A1 | 4/2008 | Nagasaka | |
| 2008/0163033 A1 | 7/2008 | Yim | |
| 2009/0327638 A1* | 12/2009 | Buch | G06F 11/073 |
| | | | 711/166 |
| 2010/0005366 A1* | 1/2010 | Dell | G06F 11/073 |
| | | | 714/758 |
| 2010/0177564 A1* | 7/2010 | Feeley | G06F 11/1068 |
| | | | 365/185.09 |
| 2011/0072328 A1 | 3/2011 | Cheng et al. | |
| 2011/0107191 A1 | 5/2011 | Chung et al. | |
| 2011/0231737 A1 | 9/2011 | Dachiku | |
| 2012/0059958 A1 | 3/2012 | Hnatko et al. | |
| 2012/0096321 A1* | 4/2012 | Yeh | G06F 12/0246 |
| | | | 714/710 |
| 2012/0110300 A1* | 5/2012 | Yeh | G06F 12/0246 |
| | | | 711/209 |
| 2012/0266041 A1* | 10/2012 | Wang | G06F 11/10 |
| | | | 714/752 |
| 2013/0007563 A1 | 1/2013 | Park | |
| 2013/0019049 A1* | 1/2013 | Yeh | G06F 12/0246 |
| | | | 711/103 |
| 2013/0036258 A1* | 2/2013 | Teo | G06F 12/0246 |
| | | | 711/103 |
| 2013/0054877 A1* | 2/2013 | Yeh | G06F 12/0246 |
| | | | 711/103 |
| 2013/0117632 A1* | 5/2013 | Fujinami | G06F 11/1012 |
| | | | 714/763 |
| 2014/0082259 A1* | 3/2014 | Yeh | G06F 12/0246 |
| | | | 711/103 |

FOREIGN PATENT DOCUMENTS

| | | |
|---|---|---|
| EP | 1538525 A1 | 6/2005 |
| GB | 2449348 A | 11/2008 |
| WO | WO-2010129305 A1 | 11/2010 |

OTHER PUBLICATIONS

PCT; "Notification of Transmittal of the International Search Report and the Written Opinion of the International Searching Authority, or the Declaration"; cited in PCT/US2013/033679; dated Dec. 30, 2013; 11 pages.

Extended European Search Report dated Oct. 31, 2016; EP Application No. 13880334.1; pp. 7.

* cited by examiner

MEMORY DEVICE HAVING ERROR CORRECTION LOGIC

BACKGROUND

A memory device can be used in a computing system to store data. In some cases, the memory device can be provided between a processor and a persistent storage subsystem, which is often implemented with lower speed storage device(s), such as disk-based storage device(s). The processor is able to perform data accesses at the memory device more quickly than at the persistent storage subsystem.

To address data errors that may occur in a memory device, an error detection and correction technique can be employed for protecting data stored in a memory device. Error correction codes can be stored with data in the memory device, and the error correction codes can be used for detecting and correcting errors in data read from a memory device. Error detection and correction can cause an increase in memory access latency, which can reduce the speed at which data of the memory device can be accessed.

BRIEF DESCRIPTION OF THE DRAWINGS

Some embodiments are described with respect to the following figures.

DETAILED DESCRIPTION

Figure 1:
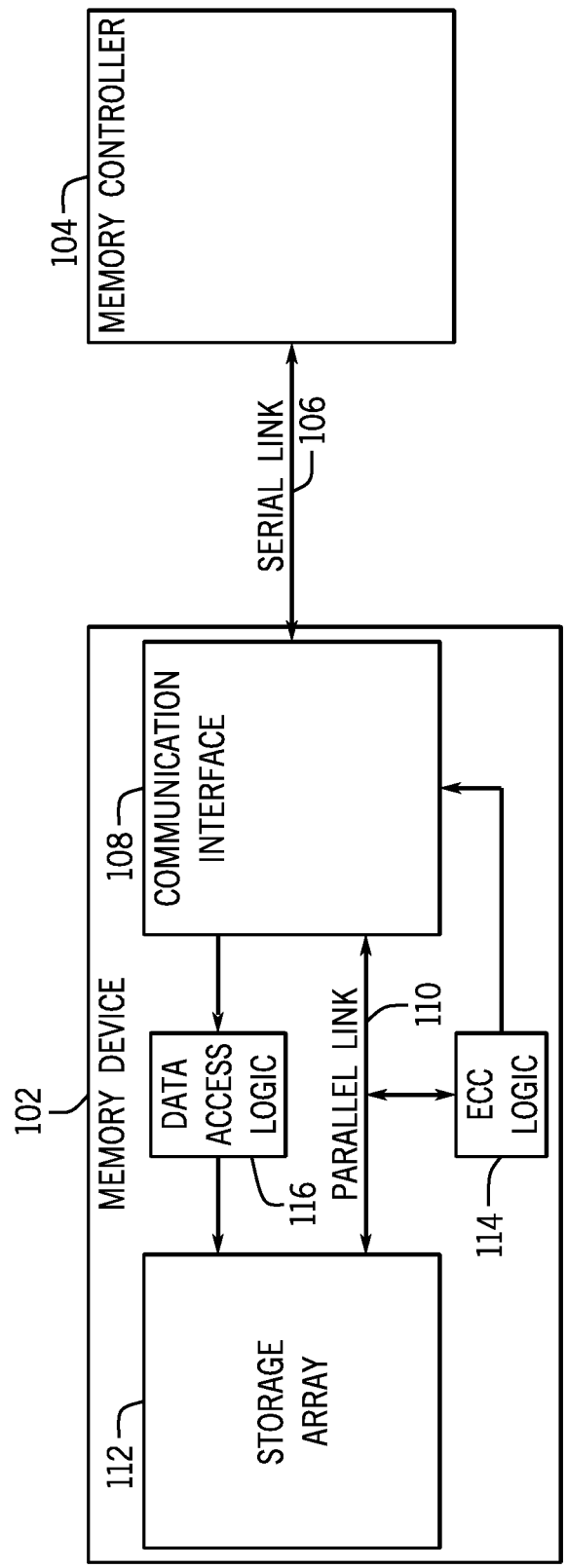
FIG. 1 is a block diagram of an example system that includes a memory controller and a memory device according to some implementations.

As dimensions of memory devices have continued to shrink, the memory devices may be more prone to suffer data errors, which have led to increased data error rates in the memory devices. There are various different types of memory devices that can be used in computing systems (e.g. desktop computers, notebook computers, tablet computers, smartphones, server computers, storage systems, communication nodes, etc.).

Examples of memory devices include dynamic random access memory (DRAM) devices, flash memory devices, phase change memory devices, memristor memory devices, and so forth. A memristor memory device can store data using memristors that store data based the resistance level of each cell. When a sufficiently large electrical current flows in a first direction through a memristor, the electrical resistance of the memristor increases. When a sufficiently large electrical current flows in the opposite direction through the memristor, the resistance of the memristor decreases. When the current is stopped, the memristor retains the last resistance that it had, which provides a representation of a data bit stored by the memristor.

A memory cell of a phase change memory device is also effectively a variable resistor. In some cases, the variable resistor can be formed of chalcogenide glass. To write to a phase change memory cell, the cell is heated, which melts the material, which is then cooled. The rate of cooling controls the crystal size of the resulting solid material, which controls the resistance of the memory cell. Different resistance levels can represent different data states.

In some cases, data error rates can be affected by how writes are performed to write data to a memory device. With a memristor memory device, for example, an electrical current flow is used for writing a data state to a particular memristor. A relatively low electrical current level can be used for writing memristors to extend the life of the memristors. However, using relatively low electrical current levels to write to memristors can result in higher rates of data bit errors.

Other types of memory devices are also associated with respective factors that can result in increased data error rates.

In some systems, error detection and correction can be performed in a memory controller that is used for managing access of a memory device (or multiple memory devices). However, performing error detection and correction at the memory controller can increase memory access latency. When error detection and correction is applied at the memory controller, the memory controller has to first receive read data from the memory device. After all of the read data (along with corresponding error correction codes) is received, the memory controller can then apply memory error detection and correction, which involves computations that may add to the overall time involved in providing data from the memory device to a requestor of the data. The requestor can be a processor or other device in the computing system.

In accordance with some implementations, an inline error detection and correction technique or mechanism is provided to perform inline error detection and correction of data within the memory device, as the data read from the memory device is delivered over a data link between the memory device and the memory controller. The data path inside the memory device may be a parallel path, where a collection (e.g. row) of data bits (along with bits corresponding to an error correction code) can be read out in parallel. Once read in parallel, the memory device can proceed to apply error detection and correction on the read data, while portions of the read data are communicated over a link between the memory device and the memory controller. The portions of the read data can be provided from the memory device to the memory controller before the error detection and correction computations at the memory device complete. As a result, the error detection and correction does not add to the data access latency in the normal case that an error is not detected.

FIG. 1 shows an example arrangement that includes a memory device 102 and a memory controller 104. The memory device 102 and the memory controller 104 are connected over a data link 106. In some examples, the data link 106 is a serial link, such as a Serializer/Deserializer (SerDes) link. In other examples, the data link 106 can be a different type of data link.

The memory device 102 includes a communication interface 108, which allows the memory device 102 to communicate over the serial link 106. In some implementations, the communication interface 108 can include a parallel-to-serial converter and a serial-to-parallel converter to convert between a serial format (used on the serial link 106) and a parallel format (used on a parallel link 110 within the memory device 102). A parallel link 110 has multiple data paths over which data bits can be communicated in parallel. In contrast, the serial link 106 has one data path over which data bits are communicated serially.

The parallel link 110 is provided between a storage array 112 and the communication interface 108. The storage array 112 includes an array of memory cells, which can be DRAM cells, flash memory cells, memristor cells, phase change memory cells, and so forth, depending on the type of the memory device 102. More generally, a memory cell refers to circuitry used to store a data bit (or data bits).

The parallel link 110 allows a collection of data bits (e.g. a row of data bits or some other segment of data bits) to be retrieved at the same time from the storage array 112. For example, the collection of data bits can include read data as well as error correction code (ECC) bits. Once read in parallel from the storage array 112, the read data and ECC is available on the parallel link 110 to error detection and correction logic 114 (referred to herein as "ECC logic 114").

Also, the read data on the parallel link 110 can be provided to the communication interface 108, where the read data is converted to a format suitable for communication over the link 106. For example, as noted above, the communication interface 108 can apply a parallel-to-serial conversion.

In accordance with some implementations, during the time that the read data is being provided from the parallel link 110 through the communication interface 108 to the serial link 106, the ECC logic 114 can perform computations relating to error detection and correction on the read data. Examples of error detection and correction techniques that can be applied include symbol-based ECC techniques, such as a Reed-Solomon ECC technique, or bit-based ECC techniques, such as a BCH technique. Although reference is made to example ECC techniques, it is noted that in other implementations, the ECC logic 114 can apply other types error detection and correction techniques.

The error detection and correction technique performed by the ECC logic 114 is considered to be an inline error detection and correction technique, in that the error detection and correction can be performed while the communication interface 108 is transferring portions of data read from the storage array 112 over the serial link 106 to the memory controller 104. Stated differently, the communication interface 108 is able to transfer read data from the storage array 112 of the memory device 102 over the serial link 106 to the memory controller 104, prior to completion of error detection and correction of the read data by the ECC logic 114 inside the memory device 102.

By performing inline error detection and correction using the ECC logic 114, data read from the storage array 112 is protected against errors without adding to the memory access time. For example, if the memory device 102 were to wait until the error detection and correction were completed by the ECC logic 114 before transferring the read data from the memory device 102 to the memory controller 104, then memory access latency would be increased.

The memory device 102 also includes data access logic 116, which is responsive to a command received from the memory controller 104 through the communication interface 108 to issue respective commands to the storage array 112. The request received from the memory controller 104 can be a read request or a write request.

If the ECC logic 114 determines that there is no error in the read data that is transferred from the memory device 102 to the memory controller 104, then the ECC logic 114 does not have to take any further action, since the read data has been transferred to the memory controller 104 is without error.

However, if the ECC logic 114 determines that an error is present in the read data that is or has been transferred to the memory controller 104, then the ECC logic 114 can provide an indication to the memory controller 104 regarding the presence of an error in the transferred data. The indication can be an indication that the read transaction has failed. The indication that the transaction has failed can be an explicit failed indication (e.g. a signal asserted to a specified state). Alternatively, the indication can be implicitly communicated to the memory controller 104 by "poisoning" a check code that is used to protect communication over the serial link 106. An example of a check code is a cyclic redundancy check (CRC) code. To protect data transferred over the serial link 106, the communication interface 108 can produce a CRC code, which is calculated based on the content of the data to be transferred over the serial link 106. The CRC code can then be provided with the actual data over the serial link 106. At the memory controller 104, the memory controller re-generates the CRC code based on the received data, and compares the re-generated CRC code with the received CRC code. If the CRC codes match, then that means that the data transfer over the serial link 106 was successful. However, if the CRC codes do not match, then that is an indication that a data communication error has occurred over the serial link 106. Poisoning the CRC code refers to deliberately making the CRC code wrong or invalid such that the CRC code comparison performed at the memory controller 104 in response to the received data would result in a determination of a data communication error.

Once the ECC logic 114 detects an error in the data, in some implementations, the ECC logic 114 can correct the error, assuming that the data error is of a type that is correctable using the associated error correction code. For example, the error correction code associated with a specific collection of data bits can correct up to n bits of error, where $n \geq 1$.

When the memory controller 104 receives the indication of failed transaction (either explicit indication or implicit indication as discussed above), in some implementations, the memory controller 104 can retry a read of the erroneous data. In response to the retried read, the communication interface 108 can provide the corrected data (corrected by the ECC logic 114) to the memory controller 104.

In alternative implementations, instead of the memory controller 104 performing a read retry in response to a failed read transaction indication, the memory device 102 can send the ECC to the memory controller 104 if the ECC logic 114 detects an error in the data that can be corrected. In such implementations, the ECC logic 114 does not perform the error correction—instead, the error correction is performed by the memory controller 104.

The memory controller 104 can stall the return of data to a requestor (e.g. processor or other requestor) until the memory controller 104 has completed the error correction of the data. Furthermore, in such implementations, the memory controller 104 can proceed to correct the data stored in the memory device 102 by writing the corrected data back to the memory device 102.

Figure 2:
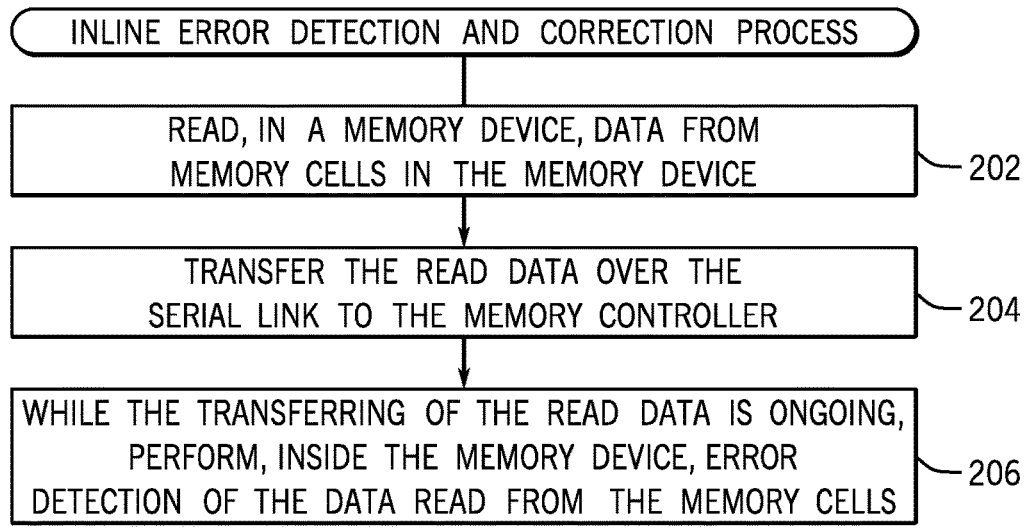
FIG. 2 is a flow diagram of an inline error detection and correction process according to some implementations.

FIG. 2 is a flow diagram of an inline error detection and correction process, according to some implementations. The process of FIG. 2 can be performed by the memory device 102, for example. The process reads (at 202), in the memory device 102, data from the memory cells of the storage array 112 in the memory device 102. The read data is transferred (at 204) over the serial link 106 to the memory controller 104. While the transferring of the read data is ongoing, error detection of the data read from the memory cells is performed (at 206) by the ECC logic 114 inside the memory device 102. In other words, the error detection of the read data is performed concurrently with the transfer of the read data over the serial link 106.

Figure 3:
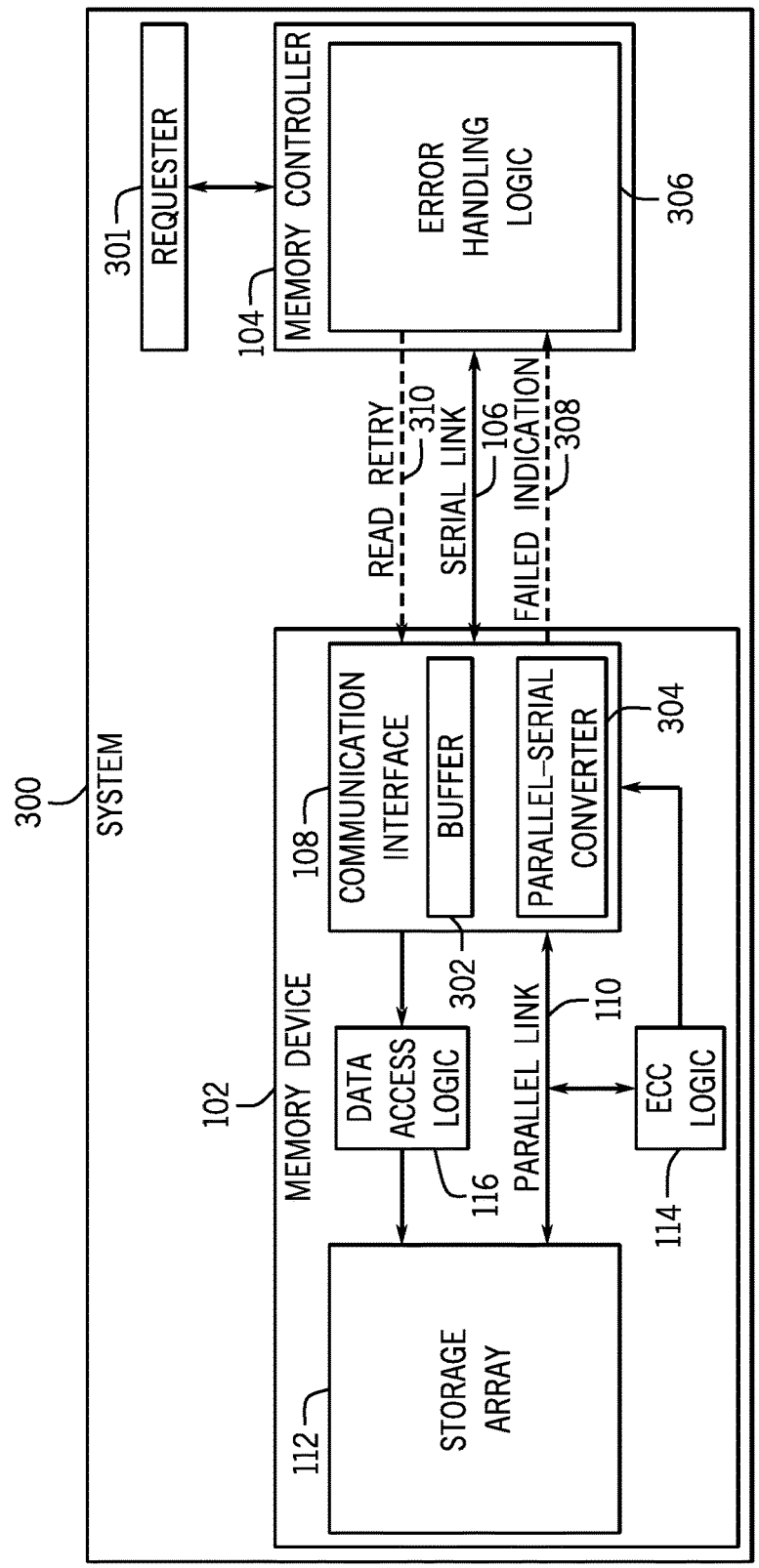
FIG. 3 is a block diagram of an example system according to further implementations.

FIG. 3 is a block diagram of an example system 300 according to alternative implementations. In addition to the memory device 102 and the memory controller 104, a requestor 301 is also present in the system 300. The requestor 301 is able to issue data requests (read requests or write requests) for accessing data in the memory device 102. In response to a data request from requestor 301, the memory controller 104 issues a respective data request to the memory device 102.

As further depicted in FIG. 3, the communication interface 108 in the memory device 102 includes a buffer 302 and a parallel-serial converter 304. The buffer 302 is used to temporarily store data that is read from the storage array 112 that is to be delivered over the serial link 106 to the memory controller 104. The parallel-serial converter 304 converts data between the parallel format on the parallel link 110 and the serial format on the serial link 106.

The memory controller 104 includes error handling logic 306, which is responsive to a failed read transaction indication 308 from the memory device to perform an error handling procedure. The error handling procedure can include sending a read retry 310 to the memory device 102, to perform a retry of the data read. The error handling procedure can also alternatively wait for an error correction code to be received from the memory device 102 for use in correcting the received data. Also, the error handling procedure can include performing a write of the corrected data back to the memory device 102.

By using techniques or mechanisms according to some implementations, data correctness can be checked without adding to the access time latency, except in situations where an error occurs, in which case extra time would be added to perform the data handling procedure to correct the data error. When there is no data error, an error correction code does not have to be provided from the memory device 102 to the memory controller 104, in some implementations. This can reduce consumption of the data bandwidth over the serial link 106, since error correction codes do not have to be provided in non-error situations.

In the foregoing description, numerous details are set forth to provide an understanding of the subject disclosed herein. However, implementations may be practiced without some or all of these details. Other implementations may include modifications and variations from the details discussed above. It is intended that the appended claims cover such modifications and variations.

What is claimed is:

1. A non-transitory memory device comprising:
   a communication interface to communicate over a link to a memory controller that is external of the memory device;
   data access logic to read data from memory cells, wherein the communication interface is to output the read data through the communication interface over the link; and
   error correction logic to perform error detection of the read data using an error correction code associated with the read data, wherein the error correction logic is to perform the error detection concurrently with portions of the read data being communicated over the link;
   wherein the error correction logic is to output an indication of failure to the memory controller in response to the error correction logic detecting an error in the read data;
   wherein the error correction logic is to output the error correction code to the memory controller in response to detecting the error, and to decline to output the error correction code if no error is detected in the read data wherein the link is a serial link; and
   wherein the communication interface comprises a parallel-serial converter to convert between data of a parallel format used internally in the memory device and data of a serial format used on the serial link.

2. The memory device of claim 1, further comprising a parallel link in the memory device, wherein the error correction logic is to receive the read data over the parallel link from the memory cells.

3. The memory device of claim 1, wherein the failure indication includes a signal asserted to a specific state.

4. The memory device of claim 1, wherein the failure indication is provided by poisoning a check code associated with transfer of the read data over the link.

5. The memory device of claim 1, wherein the memory device is to receive a read retry from the memory controller, where the read retry is responsive to the failure indication.

6. The memory device of claim 1, wherein provision of the error correction code to the memory controller allows the memory controller to correct the read data using the error correction code.

7. A method comprising:
   reading, in a memory device, data from memory cells in the memory device;
   transferring the read data over a link to a memory controller that is external of the memory device;
   while the transferring of the read data is ongoing, performing, inside the memory device, error detection of the read data using an error correction code; and
   in response to determining that error exists in the read data, sending a failure indication to the memory controller by poisoning a check code associated with transfer of the read data over the link.

8. The method of claim 7, wherein the transferring of the read data over the link to the memory controller occurs prior to completion of the error detection of the read data inside the memory device.

9. The method of claim 7, further comprising:
   determining, by the memory device, whether error exists in the read data;
   in response to determining that no error exists in the read data, declining to send the error correction code to the memory controller.

10. A system comprising:
    a memory controller;
    a memory device; and
    a serial link interconnecting the memory controller and the memory device, wherein the memory device comprises:
    a communication interface to communicate over the serial link, the communication interface comprising a parallel-serial converter to convert between data of a parallel format used internally in the memory device and data of a serial format used on the serial link;
    data access logic to read data from memory cells; and
    error correction logic to perform error detection of the read data using an error correction code associated with the read data, wherein the communication interface is to output portions of the read data through the communication interface over the serial link prior to completion of the error detection of the read data;
    wherein the error correction logic is to output an indication of failure to the memory controller in response to the error correction logic detecting an error in the read data; and
    wherein the error correction logic is to output the error correction code to the memory controller in response to detecting the error, and to decline to output the error correction code if no error is detected in the read data.

11. The system of claim 10, wherein the error correction logic is to output portions of the read data through the communication interface over the serial link while performing error detection on the read data.

12. The memory device of claim 2, wherein the error correction logic to perform error detection while transferring read data over the serial link.

13. The memory device of claim 1, wherein the failure indication is an implicit indication.

14. The memory device of claim 1, wherein the failure indication is an explicit indication.

* * * * *